(12) United States Patent
Kimball et al.

(10) Patent No.: US 7,061,313 B2
(45) Date of Patent: Jun. 13, 2006

(54) DUAL FEEDBACK LINEAR AMPLIFIER

(75) Inventors: Donald Felt Kimball, San Diego, CA (US); Joseph L. Archambault, San Diego, CA (US); Walter Haley, Escondido, CA (US); Lennart Mathe, San Diego, CA (US)

(73) Assignee: Telefonaktiebolaget LM Ericsson (publ) (SE)

( * ) Notice: Subject to any disclaimer, the term of this patent is extended or adjusted under 35 U.S.C. 154(b) by 714 days.

(21) Appl. No.: 10/055,523

(22) Filed: Jan. 23, 2002

(65) Prior Publication Data

US 2003/0137344 A1  Jul. 24, 2003

Related U.S. Application Data

(63) Continuation-in-part of application No. 09/911,105, filed on Jul. 23, 2001, now Pat. No. 6,583,664, which is a continuation of application No. 09/566,194, filed on May 5, 2000, now Pat. No. 6,300,826.

(51) Int. Cl.
   *H03F 1/36* (2006.01)
(52) U.S. Cl. .................. 330/103; 330/109; 330/294; 330/107; 330/110; 327/345
(58) Field of Classification Search ............... 330/109, 330/103, 294, 107, 110; 327/336, 345, 427, 327/562, 561
   See application file for complete search history.

(56) References Cited

U.S. PATENT DOCUMENTS

| 4,415,868 | A |   | 11/1983 | Gross |
| 5,317,277 | A |   | 5/1994 | Gavigelli |
| 5,708,376 | A | * | 1/1998 | Ikeda ........................... 327/50 |
| 5,737,697 | A | * | 4/1998 | Yamada ...................... 455/126 |
| 5,936,464 | A | * | 8/1999 | Grondahl ..................... 330/10 |
| 6,043,707 | A |   | 3/2000 | Budnik |
| 6,300,826 | B1 |   | 10/2001 | Mathe et al. |

FOREIGN PATENT DOCUMENTS

| WO | WO 9630998 | 10/1996 |
| WO | WO 9702655 | 1/1997 |

OTHER PUBLICATIONS

IEEE Standard Dictionary of Electrical and Electronics Terms Third Edition Copyright 1984 p. 219.*

* cited by examiner

*Primary Examiner*—Michael B Shingleton
(74) *Attorney, Agent, or Firm*—Coats & Bennett, P.L.L.C.

(57) ABSTRACT

A dual feedback topology imparts stability to a multistage linear amplifier, particularly by improving overall amplifier phase margin at higher signal frequencies. With dual feedback, an inner feedback loop is closed around the first amplifier stage, which stage is configured as a current feedback amplifier. A second feedback loop is closed around the overall multistage amplifier. With a current feedback amplifier as the initial stage, the two feedback signals are current-mode signals and thus add to form the combined feedback signal. The frequency responses of the inner and outer feedback loops may be tailored for flat frequency response, or, where desired, may be adjusted to compensate or otherwise flatten overall amplifier frequency response.

52 Claims, 5 Drawing Sheets

DUAL FEEDBACK LINEAR AMPLIFIER

RELATED APPLICATIONS

This application is a continuation-in-part of the U.S. application Ser. No. 09/911,105, entitled "Apparatus and Method far Efficiently Amplifying Wideband Envelope Signals," filed on Jul. 23, 2001, now U.S. Pat. No. 6,583,664 B2, which is a continuation of the identically titled U.S. patent application Ser. No. 09/566,194, filed on May 5, 2000, now U.S. Pat. No. 6,300,826 B1.

BACKGROUND OF THE INVENTION

The present invention generally applies to linear signal amplification, and particularly relates to using inner and outer feedback loops in a multi-stage amplifier.

Linear signal amplification broadly refers to generating one signal that is directly proportional to another signal, but with some desired gain (or attenuation) in signal amplitude or power. A simple example is generating an output sine wave having twice the amplitude of an input sine wave. Of course, one understands that practical applications of linear signal amplification extend into considerably more complex and challenging examples.

Characteristically, linear signal amplification uses a closed-loop amplifier approach wherein a negative feedback loop is closed around the amplifier. That is, the amplifier output signal is fed back in inverting fashion to an input of the amplifier. The benefits of negative feedback are many and include reduction of output error, reduction of sensitivity to component or device parameters, predictability of gain over frequency, and reduced sensitivity to disturbances.

Despite the benefits of negative feedback in linear amplifiers, it can be problematic in terms of amplifier stability, for example. Stability issues arise for a number of reasons, but generally involve the relative phase of the input and feedback signals. For example, the ubiquitous operational amplifier integrated circuit finds common use in linear amplification applications. Essentially all operational amplifiers have a low-frequency pole that introduces a ninety-degree phase shift in their output signals beyond a certain frequency. As amplifier signal frequencies increase, the phase shift between input and output signals, and, therefore, between input and feedback signals, tends to increase. At some point, the relative phasing transitions through 180 degrees and negative feedback become positive feedback, which transforms the erstwhile amplifier into an oscillator.

At the frequency where the phase equals 180 degrees, the loop-gain must be substantially less than 1 to insure stability. The loop-gain is defined as the open-loop gain divided by the closed-loop gain. Phase margin is defined as the difference between 180 degrees and the phase value at the frequency where the loop-gain passes through a value of 1. A phase value substantially less than 180 degrees helps to insure stability, but a loop-gain substantially greater than 1 helps to insure accuracy and linearity. Consequently, tradeoffs between loop-gain and phase margin are usually inevitable.

Certain types of loads, and even amplifier structures, exacerbate potential stability problems. For example, capacitive loads introduce additional phase shift and further reduce amplifier phase margin, where phase margin connotes the amount of additional phase lag the amplifier can tolerate before becoming unstable. As input signal frequencies increase, potential instability problems also increase. For example, lead and frame inductances in integrated circuit devices come into play, as do trace inductances in the physical circuit boards. Further, small capacitances, such as MOSFET gate-to-drain capacitance, come into play at higher signal frequencies. In short, linear amplifier design becomes decidedly more challenging as signal frequencies increase.

Radio frequency (RF) amplifier design is one area in particular that is rich in linear amplifier design challenges. Here, the signals of interest easily extend into the tens of MHz, and oftentimes extend into the GHz range. Further complicating these design challenges, RF amplifiers are often required to provide significant output power. This power requirement and other needs drive RF amplifier design towards multi-stage amplifier implementations that use a high-current output stage often comprising an AB-class MOSFET amplifier that itself has significant capacitive loading effects on prior amplifier stages.

Indeed, multistage amplifiers, whether or not in the context of RF signal amplification, in general pose significant design challenges in terms of bandwidth capability and stability. Phase margins are typically poorer due to the greater cumulative phase shift of the multi-stage signal path. In some instances, the overall phase shift of multi-stage amplifiers is such that closing the feedback loop from the final stage output to the initial stage input invites instability rather than preventing it.

What is needed then is an approach to multi-stage amplifier design that allows designers to implement full bandwidth multistage linear amplifiers that realize the benefits of negative feedback without the attendant problems it normally introduces in such applications. Preferably, the approach would not introduce overly complex design requirements, and would be practical in terms of cost and simplicity of physical implementation.

BRIEF SUMMARY OF THE INVENTION

The present invention provides a method and apparatus for using negative feedback in multistage amplifiers, while ensuring overall amplifier stability. In a multistage amplifier, the initial stage preferably comprises a current feedback amplifier (CFA) receiving the input signal of interest at a first input, and a combined feedback signal comprising first and second feedback signals from dual negative feedback loops at a second input. A first or inner feedback loop closed around the initial stage provides the first feedback signal, while a second or outer feedback loop closed around the overall chain of at least two amplifier stages provides the second feedback signal. Because current-mode feedback is used, the two feedback signals presented in parallel at the feedback input of the initial stage algebraically combine in the desired manner.

In general, the inner feedback loop functions as a high-pass filter, while the outer feedback loop functions as a low-pass filter. In this manner, outer-loop negative feedback dominates at lower signal frequencies, while inner-loop negative feedback dominates at higher signal frequencies. The frequency responses of the dual feedback loops are tuned to provide a relatively flat overall frequency response, or may be tuned as needed to compensate for the frequency response characteristics of the multistage amplifier as might otherwise be done using pole-zero compensation. For example, the frequency crossover point of the inner and outer feedback loops might be positioned to compensate for a peak in the frequency response of the multistage amplifier.

In the context of RF signal amplification, the dual feedback approach is particularly beneficial. These particular benefits arise in part from the significant improvements in overall amplifier phase margin provided by the dual feedback topology. RF signals often comprise MHz-range signals requiring high-power amplifier output stages that are particularly problematic in terms of capacitive and inductive effects at higher signal frequencies. With dual feedback, the higher frequency components of interest are fed back with minimal phase shift by the inner loop, even as the outer feedback signal is rolling off with increasing frequency. Thus, limiting the bandwidth of the outer loop prevents final output stage signals having excessive phase shift from being fed back to the initial or first stage input, but the presence of the inner loop still allows closed-loop control of these higher frequency signal components.

In practice, the dual feedback configuration associated with the present invention applies to any multistage amplifier, provided inner and outer-loop feedback signals are properly combined at the initial stage. As such, dual feedback multistage amplifiers may be used across a broad range of applications, with RF amplifiers representing just one of the many possible applications of the present invention.

DETAILED DESCRIPTION OF THE INVENTION

Figure 1:
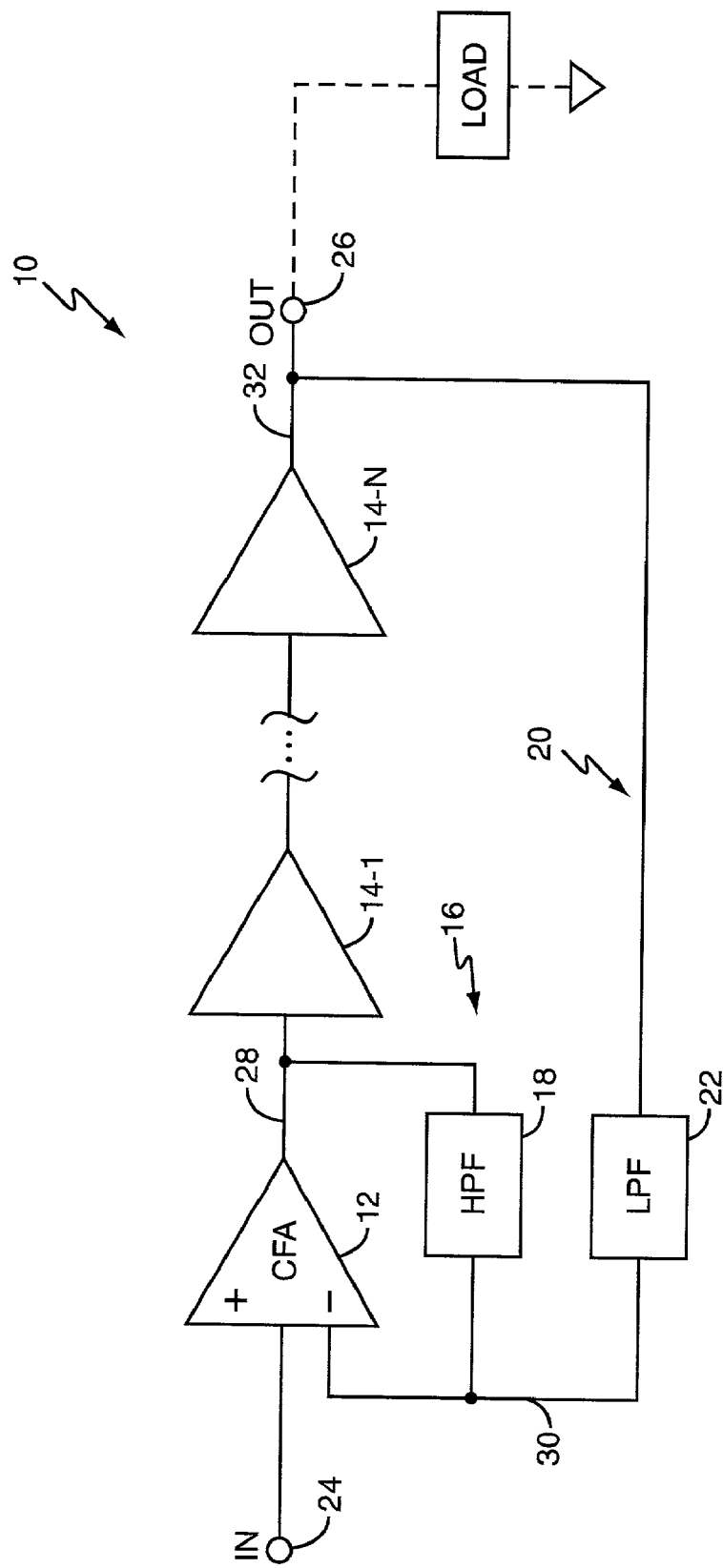
FIG. 1 is a diagram of a multistage amplifier with exemplary dual feedback.

FIG. 1 illustrates an exemplary multistage amplifier 10 in accordance with the dual feedback topology of the present invention. In the illustration, the multistage amplifier 10 comprises an initial stage 12, and one or more subsequent stages 14-1 through 14-N, a first or inner feedback loop 16 preferably including a high pass filter (HPF) 18 closed around just the initial stage 12, a second or outer feedback loop 20 preferably including a low pass filter 22 closed around the overall collection of stages 12 and 14, an input 24 to receive a signal to be amplified, and an output 26 to provide a final output signal from the multistage amplifier 10.

Amplifier stages beyond the initial stage 12 are generally referred to as stages 14, with individual stages 14 referred to as 14-1, 14-2, and so on. In general, the multistage amplifier 10 comprises at least the initial stage 12 and one subsequent stage 14. The amplified signal from the output 28 of the initial stage 12 is coupled to the signal input of the final stage 14-N, either directly where the next stage 14-1 is the final output stage, or indirectly through whatever number of intermediate stages 14-1 and so on are between the initial stage 12 and the final one of the output stage 14 used in the given implementation of multistage amplifier 10. Thus, the term "coupled to" as used herein denotes both direct and indirect connection.

In any case, the multistage amplifier 10 comprises a chain of two or more amplifier stages, wherein each successive stage provides the succeeding stage with an output signal responsive to the input signal received by that stage. In this manner, the final output signal generated by the multistage amplifier 10 is responsive to the input signal to be amplified that is applied to the initial stage 12.

While stages 14 need not be any particular type of circuit, the first stage 12 is configured to use or otherwise respond to the first and second current-mode feedback signals from the inner and outer feedback loops 16 and 20, respectively. In an exemplary approach, the initial stage 12 comprises a current feedback amplifier (CFA) circuit responsive to the first and second feedback signals.

Alternative approaches might employ a transconductance circuit that generates voltage-mode signals responsive to the first and second current-mode signals. With that approach, the initial stage 12 might be configured as a voltage-mode amplifier responsive to, for example, the sum of the voltages output by the transconductance circuit. In any case, the initial stage 12 responds to dual current-mode feedback signals. Some of the reasons for this input stage configuration are explained below.

As noted, the multistage amplifier 10 uses feedback taken from two different points, namely the output 28 of the initial stage 12, and the output 32 from the final one of the succeeding stages 14. A first feedback signal is applied to a summing node 30 by the inner feedback loop 16, while a second feedback signal is applied to the same node by the outer feedback loop 20. Summing node 30 couples these two feedback signals to the feedback input of the initial stage 12, here, the inverting input of the CFA comprising initial stage 12.

With voltage-mode feedback, the first and second feedback signals would not combine properly at summing node 30, given their parallel presentation at the node from feedback loops 16 and 20, respectively. Currents, however, do properly combine in parallel. Therefore, the first and second feedback signals are current-mode signals, and the initial stage 12 is configured to be responsive to those current-mode signals. More specifically, the first and second feedback signals are summed at summing node 30 to form a combined feedback signal for the initial stage 12.

Figure 2:
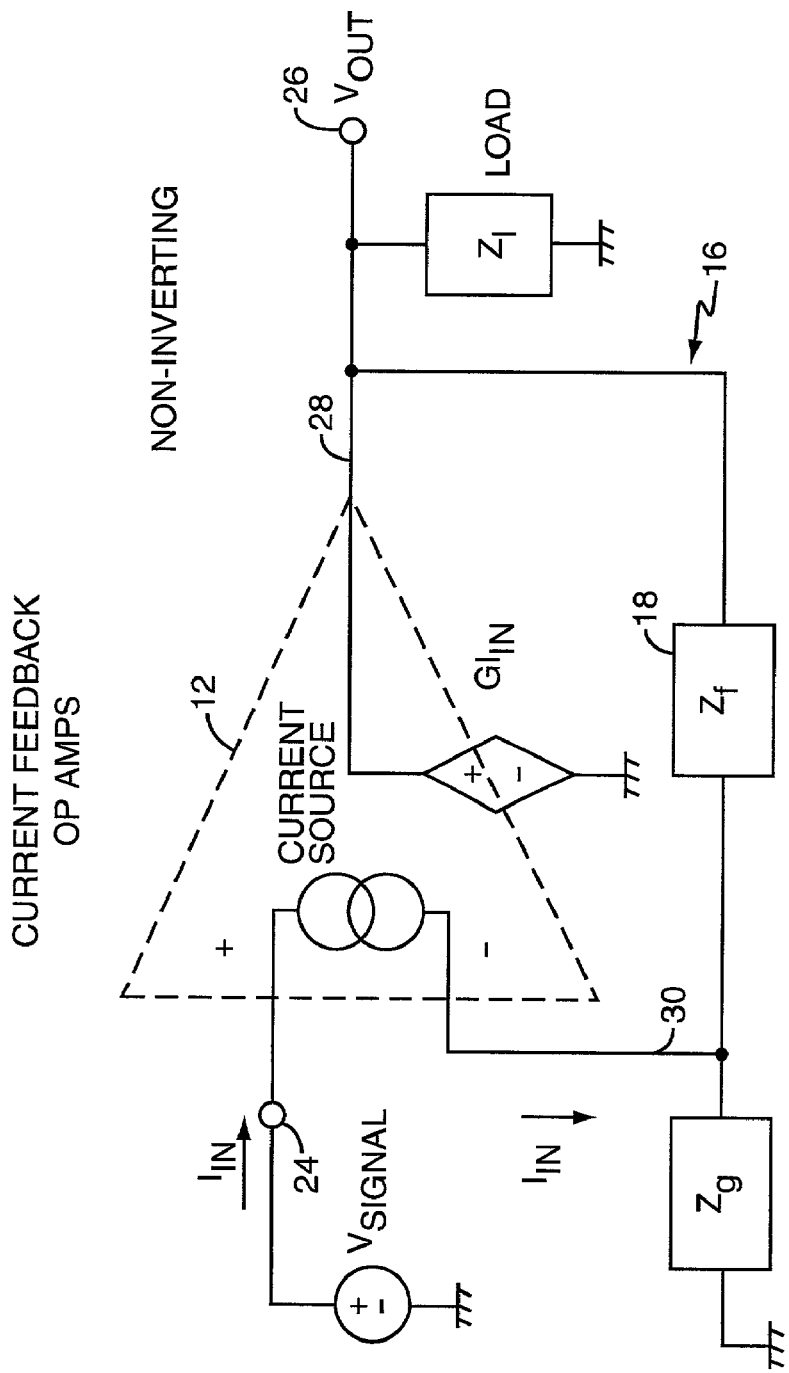
FIG. 2 is a diagram of a current feedback amplifier.

CFAs are generally well understood by those skilled in the art, but a brief, simplified presentation of their fundamentals might prove instructive with regard to later detailed discussion of the multistage amplifier 10. FIG. 2 illustrates a simplified CFA in non-inverting configuration in the context of input stage 12. Note that the illustration depicts only the inner feedback loop 16 for simplification.

A signal source V_SIGNAL provides an input signal current on the amplifier input 24 that includes a current component I_IN. A current source between the non-inverting and inverting inputs of CFA 12 sources current into summing node 30, which divides between a gain-setting impedance Zg and the feedback loop impedance Zf, which, here, is HPF 18. In a CFA, the inverting node 30 is traditionally referred to as a current source output. A current-controlled output voltage source generates the amplified output signal V_OUT on output 28 as a function of G*I_IN, where G represents the amplifier gain. In a CFA, G is traditionally referred to as transimpedance, and has units of Ohms. The output signal V_OUT is shown supplying a load impedance ZI, which in the context of the multistage amplifier 10 will be the input impedance of the immediately succeeding stage 14.

The ratio of output-to-input voltage is expressed as, $$\frac{V\_OUT}{V\_IN} = \left(\frac{G}{G+Zf}\right)\left(1 + \frac{Zf}{Zg}\right). \quad (1)$$

This expression assumes that G→∞ and may be simplified as, $$\frac{V\_OUT}{V\_IN} = 1 + \frac{Zf}{Zg}. \quad (2)$$

Thus, the gain of the input stage 12 is a function of current division between the first and second feedback loops 16 and 20, respectively, and a gain path to ground (not shown in FIG. 1) through the gain-setting impedance Zg.

In addition to the more fundamental need to combine parallel feedback signals inherent to the dual feedback topology, configuring the first stage 12 as a CFA offers additional benefits. For example, unlike voltage-mode amplifiers that directly trade between closed-loop gain and amplifier bandwidth, CFAs offer flat amplifier response across a wideband frequency range independent of moderate closed loop gain. In a CFA, the bandwidth is a function of Zf compared to G as shown in equation (1). This ability to have relatively high gain in the first stage reduces the need for higher gains in subsequent stages 14 which may be voltage-mode amplifier circuits. Of course, other considerations, such as input noise and overall multistage amplifier gain needs will ultimately determine the relative gains of the different stages.

The advantages of the dual feedback topology are many, and include, but are not limited to, greatly enhanced amplifier stability through increased phase margin and reduced sensitivity to component aging, temperature drift, and layout parasitics, as well as simplified frequency response compensation. Because of its inherent stability, the dual feedback approach also simplifies design and implementation because the need for feedback tuning is eliminated or greatly reduced. Further, the stability advantages of dual feedback increase the electromagnetic interference (EMI) immunity of multistage amplifiers. Some of the characteristics underlying these advantages and exemplary dual feedback application are explored below.

Amplifier phase shift is unavoidable; essentially all operational amplifiers have at least one low-frequency pole owing to their high gain and unavoidable output capacitance. This pole introduces ninety-degrees of phase shift, and particular circuit configurations may introduce additional phase shift. Additional amplifier stages exacerbate the problem by adding additional phase shift. The upshot of this unavoidable phase shift is that closed-loop feedback from final output to initial input in multistage amplifiers can lead to stability problems at relatively low signal frequencies. Indeed, with three or more stages and capacitive or inductive loading, designers often consider closed-loop feedback impractical.

Limiting input signal bandwidth to frequencies below the point where cumulative phase shift leads to instability represents one approach, but is impossible where the signal to be amplified is an inherently wideband signal having frequency components well beyond the point of amplifier instability. Another approach involves limiting the bandwidth of the negative feedback loop, but this obviously compromises the accuracy of the amplified output signal by intentionally attenuating or phase shifting the signal at higher frequencies.

In contrast, the dual feedback approach balances the need for overall closed-loop control with the need for limiting the amount of phase shift introduced in the feedback signal. This balance is accomplished by feeding back higher frequency signal components via the inner feedback loop 16, which is closed only around the first stage 12. Thus, the amount of phase shift in this first feedback signal is limited to that incurred in just the initial input stage of the multistage amplifier 10. Lower frequency components of the final output signal are fed back using the outer feedback loop 20.

The frequency responses of the two loops 16 and 20 are tuned in accordance with the needs of a particular design. Overall guidelines for setting the frequency response include limiting the bandwidth of the outer loop 20 to a frequency below the point at which phase shift in the final output signal would lead to instability if fed back to the input stage 12. Other considerations include the overall frequency response desired for the multistage amplifier 10.

In general, the frequency responses of the two feedback loops are matched so that the outer feedback loop 20 dominates at lower signal frequencies, while the inner feedback loop 16 dominates at higher signal frequencies. Typically, one desires a flat frequency response from the multistage amplifier 10. Where the frequency responses of the stages comprising the multistage amplifier 10 are essentially flat, making the parallel combination of inner and outer loop feedback impedances constant across the signal frequency range of interest preserves this flatness. In addition, the overall ratio of the feedback impedance to the gain impedance also must be maintained to preserve the overall gain.

Interestingly, dual feedback offers a superior compensation approach compared to traditional pole-zero compensation techniques that might otherwise be needed where the frequency response of one or more amplifier stages is not flat. For example, the multistage amplifier 10 may exhibit peaking around certain signal frequencies, or may exhibit unwanted attenuation at one or more other frequencies. In these cases, the frequency responses of the inner and outer feedback loops 16 and 20 may be tuned to compensate for the undesirable characteristics of the amplifier's frequency response.

As an example, the lower frequency roll-off of the HPF 18 in the inner loop 16 may be set with respect to the upper frequency roll-off of the LPF 22 in the outer loop 20, such that the combination of feedback loops imparts frequency attenuation in the range where the multistage amplifier 10 exhibits frequency peaking. More specifically, the crossover frequency of the combined inner and outer feedback loops 16 and 20 may be positioned to coincide with a frequency response peak of the multistage amplifier 10.

By controlling the overlap between the lower and upper roll-off frequencies of the inner and outer feedback loops 16 and 20, any desired frequency-dependent attenuation or boosting is accomplished at or about the crossover frequency. Of course, more complex frequency compensation may be achieved if multiple poles are implemented in one of both of the feedback loops 16 and 20. Inductor-capacitor (LC) circuits represent one approach to implementing multiple-pole feedback loops.

Figure 3:
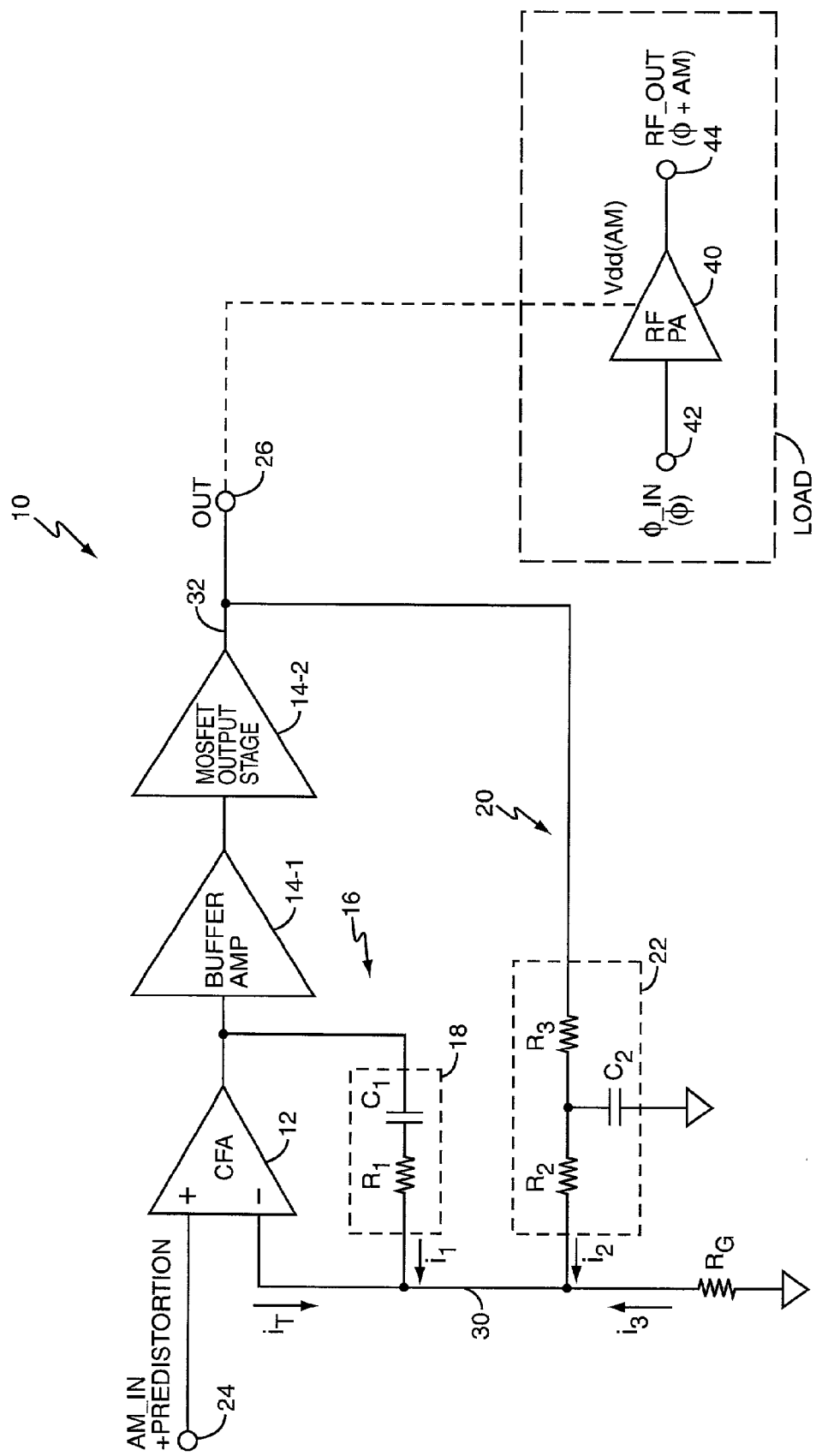
FIG. 3 is a diagram of a multistage amplifier incorporating dual feedback and configured as a Vdd amplifier for a RF power amplifier load.

While the range of applications for dual feedback amplifiers is quite broad, FIG. 3 introduces an exemplary use in the context of RF envelope elimination and restoration (EER). With EER, a RF signal is separated into amplitude modulation and phase modulation information. A RF power amplifier (PA) operating in saturated mode for efficiency reasons receives and amplifies the phase modulation signal, which is a constant-envelop signal, and, therefore, appropriate for amplification by a saturated mode amplifier. To impart the desired amplitude modulation to the PA's output signal, the Vdd supply signal of the PA is modulated in accordance with the amplitude modulation information signal. Since the output voltage of the PA operating in saturated mode follows its supply voltage, modulating the amplitude of the Vdd supply signal effectively modulates the PA's output signal.

For detailed information regarding EER circuits and their application, the reader is referred to the U.S. Pat. No. 6,300,826 B1 issued to Mathe et al. ('826 patent), which is incorporated in its entirety herein by reference. The co-pending continuation application of the '826 patent (application Ser. No. 09/911,105, entitled "Apparatus and Method for Efficiently Amplifying Wideband Envelope Signals," and filed on Jul. 23, 2001, also is incorporated in its entirety herein by reference. The below discussion provides limited Vdd amplifier details, with its focus on the exemplary multistage amplifier 10.

In FIG. 3, the multistage amplifier 10 may be used as a "Vdd amplifier," and comprises three stages: the input stage 12, an intermediate buffer amplifier stage 14-1, and a MOSFET-based final output stage 14-2. The final output stage 14-2 provides the final output signal of the multistage amplifier 10, which signal here functions as the Vdd supply signal for the RF power amplifier (PA) 40.

The PA 40 provides power amplification for a constant-envelope, phase-modulated input signal φ_IN received on its input terminal 42. Thus, the output signal RF_OUT generated at the output terminal 44 of the PA 40 includes the phase modulation information in its input signal, as well as the amplitude modulation information carried by the Vdd supply signal from the multistage amplifier 10. That is, the multistage amplifier 10 provides the Vdd supply signal to the PA 40 responsive to the amplitude modulation information signal AM_IN applied to the amplifier's input terminal 24.

Providing the amplitude modulated Vdd supply signal is challenging for a number of reasons. For example, as a rule-of-thumb, one requires roughly seven times the original bandwidth of the baseband signal when separating phase and amplitude modulation information. Where the baseband signal is already in the one-to-two MHz range, this relationship results in an amplitude modulation signal AM_IN having upper frequencies approaching ten MHz. Where the AM_IN signal is a multi-carrier signal combining amplitude modulation information for two or more carrier signals, it can easily include frequencies up to and beyond thirty MHz.

In addition to the high frequency requirements, the multistage amplifier 10 must generate significant output power, because the load, here PA 40, is a relatively low impedance load requiring several Amps of supply current at maximum power. Indeed, this requirement for high output power introduces the need for the MOSFET implementation of the final output stage 14-2, which implementation reinforces the need for the dual feedback approach. The MOSFET-based final output stage 14-2 represents a fairly capacitive load by virtue of its input gate capacitance, and because of its parasitic capacitances, such as the internal gate-to-drain capacitances which can become particularly significant at higher signal frequencies.

These output-stage capacitances impart potentially significant phase shift to the final output signal from the multistage amplifier 10. Further, at the higher frequencies (e.g., >10 MHz), parasitic inductances become problematic in terms of introducing additional phase shift to the final output signal. Such inductances are caused by lead inductances in the physical MOSFET packages and circuit board traces, for example. It might be noted that buffer amplifier stage 14-1 nicely isolates the CFA of input stage 12 from the relative "unfriendliness" of the MOSFET output stage 14-2, which enhances the wideband performance of the input stage 12. In any case, the final output signal experiences increasingly problematic phase shift relative to the input signal AM_IN with increasing signal frequency.

Thus, the LPF 22 in the outer feedback loop 20 is configured to roll-off at some frequency below which feedback signal phase shifting would lead to amplifier instability. That is, one would evaluate the phase margin of the collective set of stages 12 and 14 comprising the multistage amplifier 10, identify the critical frequency at which phase margin passes through the zero degree point (i.e., inverts), and set the outer feedback loop 20 to roll-off the second feedback signal at some point below this critical frequency. In this way, the phase margin can be recovered and a loop-gain substantially greater than 1 can be maintained. In practice, identifying the appropriate roll-off frequency for the outer loop 20 might include both simulation and test-bench work, because the overall combination of impedances in the physical layout of the multistage amplifier 10 and the concerned load can be quite complex.

In concert with adjusting the upper frequency roll-off of the LPF 22 in the outer loop 20, one would adjust the lower frequency roll-off of the HPF 18 in the inner loop 16. As noted earlier, the two roll-offs can be matched such that the parallel combination of LPF and HPF impedances is relatively constant across the frequency range of interest, or may be adjusted to compensate for a non-flat amplifier response. In any case, the combined feedback signal at summing node 30 is dominated by the second feedback signal at lower frequencies, and by the first feedback signal at higher frequencies.

While the gradual attenuation of the second or outer feedback signal with increasing frequency seems problematic, the final output signal is actually well controlled by virtue of the first or inner loop feedback signal. This is particularly true where the final output stage 14-2 is a relatively good voltage follower, at least for small signal components of the AM_IN signal. If that condition is met, the small signal components of the amplified small signal on the output 28 from the first stage 12 are relatively good scaled representations of the small signal components in the final output signal at the output 32 of the final stage 14-2. Therefore, the inner feedback loop 16 continues to provide accurate closed-loop control for these higher-frequency, small signal components.

Not coincidentally, this ability to accurately control the small signal components of the final output signal complements use of the multistage amplifier 10 in Vdd amplification. Because the PA 40 generally has some amplitude-dependent gain variations, the RF_OUT signal from it will have distortions unless these non-linearities are corrected. One approach involves adding pre-distortion information to the AM_IN signal. Pre-distortion amounts to adding compensating distortion to the AM_IN signal in the form of relatively small-signal non-linearities that appear as strategically positioned "kinks" or bends in the AM_IN signal.

These kinks are positioned to coincide with the points at which the RF_OUT signal would be expected to include non-linearities imparted by the PA 40. Thus, the pre-distortion in the AM_IN signal combines with the distortion in the RF_OUT signal to significantly reduce the overall distortion in the RF_OUT signal. This reduction is important with regard to remaining below mandated levels of adjacent channel interference and signal non-linearity.

Thus, the AM_IN signal represents a combination of large-signal and small-signal information, with the pre-distortion information included in the small-signal portion of it. Because the final output stage 14-2 functions as a relatively good voltage-follower at least for the small signal components of AM_IN, the inner loop 16 allows for accurate closed-loop control of pre-distortion information in the final output signal from the multistage amplifier 10.

In FIG. 3, one also notes the representation of summing node currents $i_1$, $i_2$, and $i_3$, which combine to form the total current $i_T$ at the inverting input of the CFA comprising the first stage 12. In accordance with basic nodal analysis techniques, the summation of current into and out of summing node 30 is zero, indicating a balance of currents. In practical terms, this means that the sum of currents $i_1$, $i_2$, and $i_3$, is equal to current $i_T$. However, closed-loop feedback tends to force the current $i_T$ to zero, so the sum of the currents $i_1$, $i_2$, and $i_3$ without $i_T$ also tends to zero. The split of currents between the two feedback loops and the gain-setting resistor $R_G$ to signal ground determines the overall gain of the input stage 12.

Figure 4:
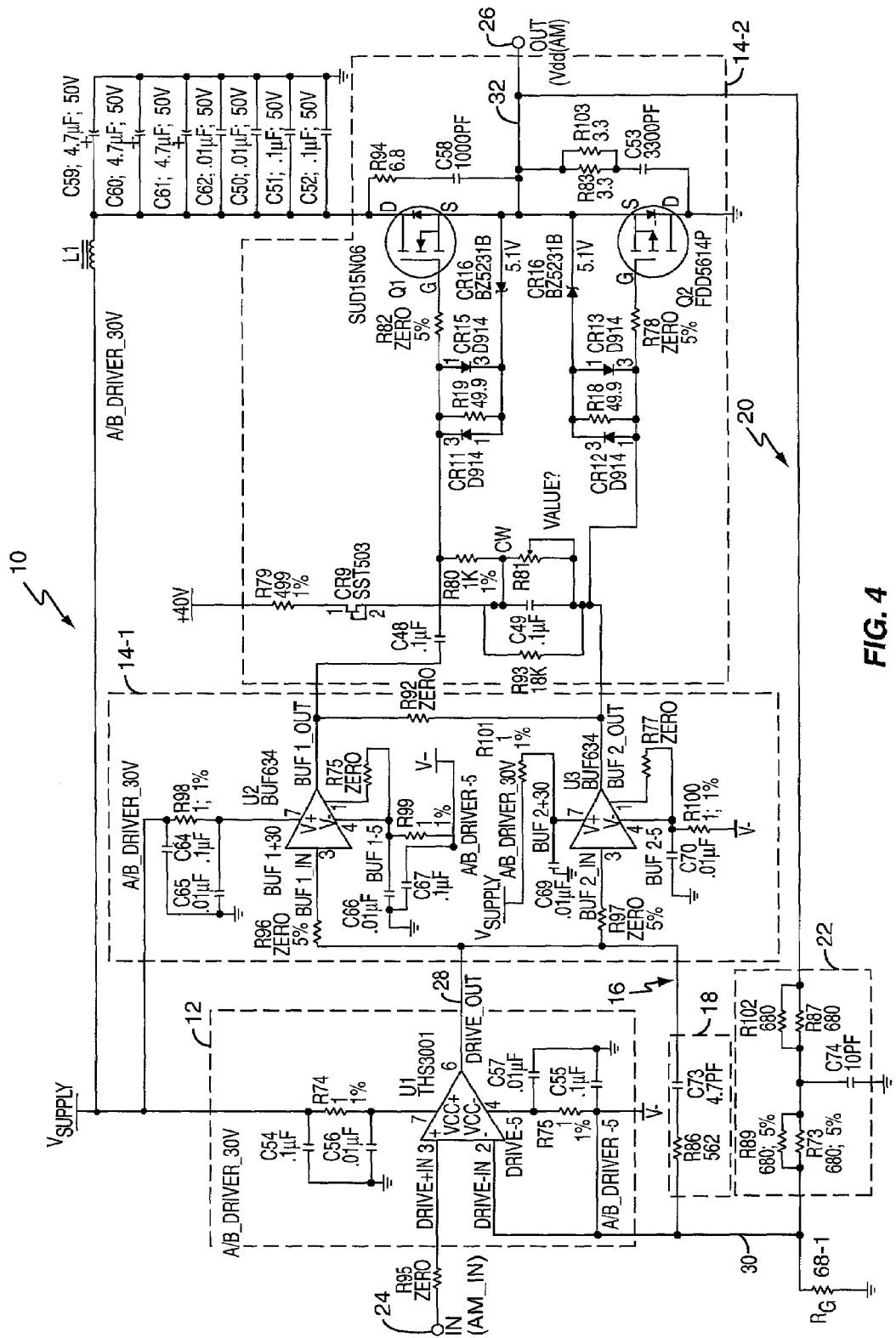
FIG. 4 is an exemplary circuit schematic of the diagram of FIG. 3.

FIG. 4 depicts exemplary circuit details for the diagram of FIG. 3. In general, the multistage amplifier 10 receives the AM_IN signal on its input terminal 24, and provides the final output signal on its output terminal 26. Power is supplied by external supply signals VSUPPLY and V-, which provide the voltage rails for the various amplifiers comprising the multistage amplifier 10. A further supply signal, +40V, provides a source of bias current for the final output stage 14-2, which is explained later. It should be understood that the actual supply voltage arrangements will be determined by the needs of a given design, and these details are merely exemplary.

The first stage 12 comprises a circuit featuring an integrated circuit current feedback amplifier U1, which here is a THS3001 from Texas Instruments, Inc., which has a business address of 12500 TI Boulevard, Dallas, Tex. 75266-0199. The THS3001 is a 420 MHz CFA providing wideband amplification of the AM_IN signal.

The second stage 14-1 comprises parallel buffer amplifier circuits based on BUF634 integrated circuit buffer amplifiers (U2 and U3) from the BURR-BROWN line of analog components offered by Texas Instruments, Inc. The BUF634 is a relatively high-speed buffer amplifier having an output slew rate of 2000 V/μS, and capable of driving 250 mA of output current. The intermediate stage 14-1 parallels BUF634s because of the relatively large transient currents associated with driving the input gates of the MOSFET final output stage 14-2.

The final output stage 14-2 functions as a Class AB amplifier and comprises a SUD15N05 N-channel MOSFET (Q2) in push-pull combination with a FDD5614P P-channel MOSFET (Q1). Many manufactures make suitable MOSFETs, with these two examples available from Vishay Siliconix, having a corporate parent doing business as Vishay Intertechnology, Inc., and having a business address of 63 Lincoln Highway, Malvern, Pa. 19355-2120. An SST503 current regulator diode (CR9), also from Vishay Siliconix, provides a small amount of bias voltage for Q1 and Q2 to prevent their completely turning off at zero crossings of the amplified output signal from the prior stage 14-1. If allowed to turn off completely, the Q1/Q2 transistors would introduce unwanted crossover distortion in the final output signal.

Figure 5A:
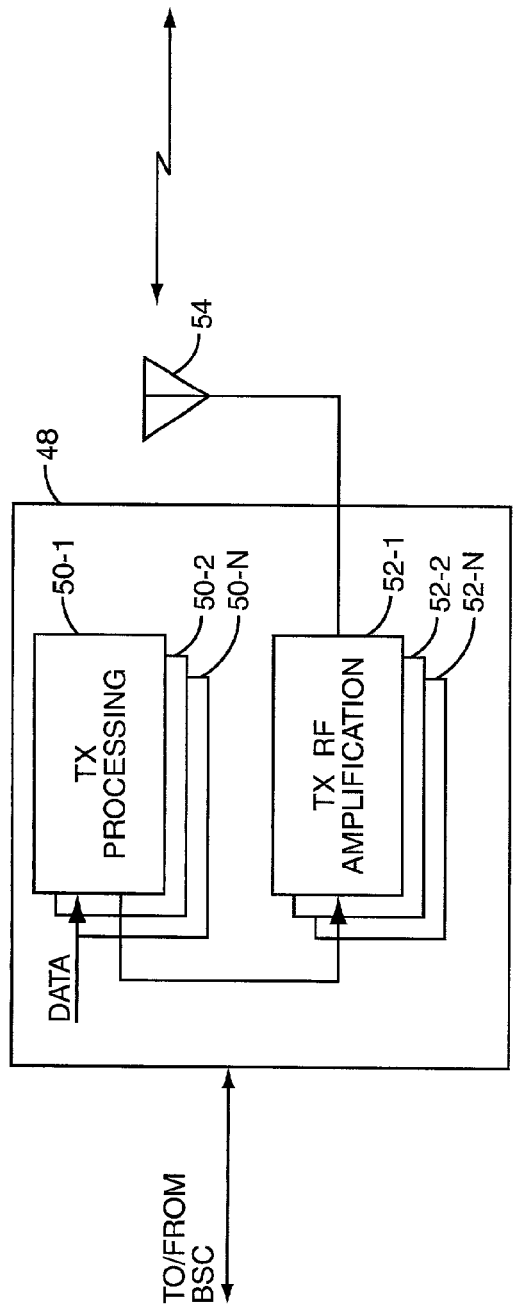
FIGS. 5A and 5B illustrate an exemplary embodiment of the present invention within a radio base station as might be used in a wireless communication network.
Figure 5B:
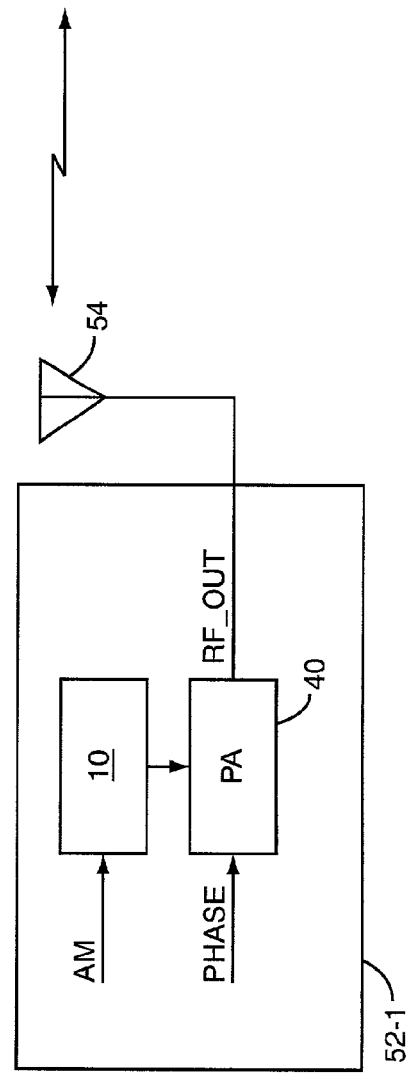

FIGS. 5A and 5B illustrate an exemplary use of an embodiment of the multistage amplifier 10 within the context of a radio base station (RBS) 48, which might be used within a wireless communication network, such as a cellular communication network for example.

FIG. 5A illustrates a simplified but exemplary RBS 48 comprising transmit processing resources generally referred to by the numeral 50, and radio frequency transmitter resources generally referred to by the numeral 52. These various resources might be segregated into racks or sub-racks, and/or into processing cards within the RBS 48. Thus, transmit processing resources 50-1 through 50-N refer to segregated sets of transmit processing resources. Likewise, RF transmitter resources 52-1 through 52-N refer to segregated sets of RF transmitter resources. Those skilled in the art will appreciate that the organization of the various resources within the RBS 48 is subject to substantial variation, and that these exemplary details are not limiting with respect to use of the multistage amplifier 10 within the RBS environment.

In operation, one or more data signals corresponding to mobile stations (not shown) operating within the radio coverage area of the RBS 48 serve as inputs to the transmit processing resources 50. Transmit processing resources 50 process this data by generally applying symbol and channel encoding schemes consistent with the air interface standard, e.g., TIA/EIA/IS-2000, Wideband CDMA, etc., employed by the network in which the RBS 48 operates. These encoded signals serve as inputs to the RF transmitter resources 52, which amplify them to a level suitable for transmission via the antenna 54.

As noted earlier, EER represents one approach to RF signal amplification, and involves the separation of amplitude information from phase information. Thus, the RF transmitter resources may receive pairs of amplitude and phase modulation signals corresponding to desired transmit signal information. FIG. 5B illustrates use of the multistage amplifier 10 for EER amplification within the RBS 48. Of course, use of the multistage amplifier 10 within the RBS 48 extends beyond EER applications, as might be expected given the multistage amplifier's ability to operate with a high degree of stability over wide radio frequency signal ranges.

In FIG. 5B, one sees that the multistage amplifier 10 is applied in an arrangement similar to that illustrated in FIG. 3. That is, the multistage amplifier 10 provides a RF power amplifier 40 with a voltage supply signal modulated in accordance with corresponding amplitude modulation information. With its Vdd supply signal subjected to amplitude modulation, the RF_OUT signal generated by the RF power amplifier 40 includes both phase and amplitude modulation information. Of course, the RBS 48 generally includes many power amplifiers 40 for simultaneously generating a plurality of RF transmit signals. To that end, it should be understood that there may be a plurality of multistage amplifiers 10 implemented within RF transmitter resources 52.

Additionally, a single multistage amplifier 10 and associated RF power amplifier 40 can be used to generate a "multi-carrier" RF transmit signal. That is, in some applications, the amplitude information signal AM_IN and phase information signal φ_IN correspond to a single RF carrier. However, the amplitude and phase modulation information signals for two or more carriers may be combined, in which case the multistage amplifier/RF power amplifier pair operates with potentially much wider bandwidth signals than would be expected in single-carrier applications.

While the specific tuning of the inner and outer feedback loops 16 and 20 varies with particular design details, exemplary settings that, in general, might be applied to the circuit of FIG. 4, for example, include these values:
1) CDMA2000 1×(1.2288 Mcps) Mcps=Mega chips per second
   a) Outer loop pole at 10 MHz
   b) Inner loop zero at DC, Inner loop pole at 20 MHz
2) CDMA2000 3×(3.6864 Mcps), or WCDMA (3.84 Mcps)
   a) Outer loop pole at 30 MHz
   b) Inner loop zero at DC, Inner loop pole at 60 MHz
3) CDMA2000 3×2 Carrier (7.3728 Mcps effective), or WCDMA 2 Carrier (7.68 Mcps effective)
   a) Outer loop pole at 60 MHz without MOSFET peaking
   b) Inner loop zero at DC, Inner loop pole at 120 MHz without MOSFET peaking
   c) Outer loop pole at 50 MHz with MOSFET peaking @60 MHz
   d) Inner loop zero at DC, Inner loop pole at 60 MHz with MOSFET peaking at 60 MHz It should be understood that the Vdd amplifier configurations of the multistage amplifier 10 as discussed above represent an exemplary applications for the dual feedback topology of the present invention. However, the enhanced performance gained through the dual feedback approach is useful across a wide range of applications.

In general, the present invention provides for a multistage amplifier having at least a first stage configured as a current feedback amplifier, followed by one or more subsequent stages that may take on a wide variety of configurations. A first or inner feedback loop closes around the first stage and provides higher frequency feedback, while a second or outer feedback loop closes around the entire set of stages and provides lower frequency feedback. The two feedback loops may be tuned to achieve the desired frequency response. As such, the present invention is not limited to the exemplary details in the above discussion. Rather, the present invention is limited only by the scope of the following claims, and the reasonable equivalents thereof.

What is claimed is:

1. A multistage amplifier comprising:
   an initial stage including a first input to receive an input signal, a second input to receive a combined feedback signal, and an output, and wherein the output of the initial stage provides an amplified signal responsive to the input signal;
   a final stage including a first input coupled to the output of the initial stage and an output to provide a final output signal of the multistage amplifier, and wherein the final output signal is an amplified signal responsive to the input signal;
   a first feedback loop coupling the output of the initial stage to the second input of the initial stage, and providing a first current-mode feedback signal to the second input of the initial stage, the first feedback loop comprising a high pass filter;
   a second feedback loop coupling the output of the final stage to the second input of the initial stage, and providing a second current-mode feedback signal to the second input of the initial stage, the second feedback loop comprising a low pass filter; and
   wherein the combined feedback signal is formed by combining the first and second current-mode feedback signals.

2. The multistage amplifier of claim 1, wherein the high pass filter has a lower roll-off frequency, and the low pass filter has an upper roll-off frequency.

3. The multistage amplifier of claim 1, wherein the high pass and low pass filters comprise matched filter circuits such that a parallel combination of the high and low pass filters exhibits a desired impedance value across a signal frequency range of interest.

4. The multistage amplifier of claim 3, wherein the desired impedance value is a relatively constant value across the signal frequency range of interest.

5. The multistage amplifier of claim 4, wherein the desired impedance value varies across the signal frequency range of interest to compensate for non-uniformity in the frequency response of the multistage amplifier.

6. The multistage amplifier of claim 1, wherein the high pass filter of the first feedback loop exhibits a zero at about DC and a pole at about 20 MHz, and further wherein the low pass filter of the second feedback loop exhibits a pole at about 10 MHz.

7. The multistage amplifier of claim 1, wherein the high pass filter of the first feedback loop exhibits a zero at about DC and a pole at about 60 MHz, and further wherein the low pass filter of the second feedback loop exhibits a pole at about 30 MHz.

8. The multistage amplifier of claim 1, wherein the high pass filter of the first feedback loop exhibits a zero at about DC and a pole at about 120 MHz, and further wherein the low pass filter of the second feedback loop exhibits a pole at about 60 MHz.

9. The multistage amplifier of claim 1, wherein the multistage amplifier exhibits frequency peaking at about 60 MHz, and wherein the high pass filter of the first feedback loop exhibits a zero at about DC and a pole at about 60 MHz, and further wherein the low pass filter of the second feedback loop exhibits a pole at about 50 MHz.

10. The multistage amplifier of claim 1, wherein the upper and lower roll-off frequencies, respectively, of the low and high pass filters are set relative to a desired crossover frequency.

11. The multistage amplifier of claim 10, wherein an amount of frequency overlap between the upper and lower roll-off frequencies controls attenuation of signal frequencies near the desired crossover frequency.

12. The multistage amplifier circuit of claim 1, wherein the high and low pass filters are configured such that the first feedback signal dominates the combined feedback signal at higher frequencies, while the second feedback signal dominates the combined feedback signal at lower frequencies.

13. The multistage amplifier circuit of claim 1, wherein the upper roll-off frequency of the low pass filter is below a critical frequency at which phase shift in the final output signal would cause amplifier instability if fed back to the initial stage.

14. The multistage amplifier of claim 1, wherein the multistage amplifier further comprises at least one intermediate stage coupling the output of the initial stage to the input of the final stage.

15. The multistage amplifier of claim 14, wherein the at least one intermediate stage comprises at least one buffer amplifier.

16. The multistage amplifier of claim 14, wherein the final stage comprises a MOSFET output stage.

17. The multistage amplifier of claim 16, wherein the at least one buffer amplifier isolates the initial stage from an input capacitance of the MOSFET output stage.

18. The multistage amplifier of claim 1, wherein the multistage amplifier is configured as a supply voltage amplifier in a radio frequency envelope-elimination-and-restoration (EER) circuit.

19. The multistage amplifier of claim 18, wherein the multistage amplifier receives an amplitude modulation signal as the input signal to the first input of the initial stage, and provides a voltage supply signal at the output of the final stage responsive to amplitude modulation information in the input signal.

20. The multistage amplifier of claim 1, further comprising at least one intermediate stage, and wherein the output of the initial stage is coupled to the first input of the final stage through the at least one intermediate stage.

21. The multistage amplifier of claim 1, further comprising a buffer amplifier stage coupling the output of the initial stage to the first input of the final stage, thereby buffering the initial stage from the final stage.

22. The multistage amplifier of claim 21, wherein the final stage comprises a MOSFET output stage, and wherein the buffer amplifier stage isolates the initial stage from a capacitive loading of the MOSFET output stage.

23. A radio base station for use in a communication network, the radio base station including at least one multistage amplifier using dual feedback for signal amplification, said multistage amplifier comprising:
 an initial stage including a first input to receive an input signal, a second input to receive a combined feedback signal, and an output that provides an amplified signal that is responsive to the input signal;
 a final stage including a first input coupled to the output of the initial stage and an output to provide a final output signal of the multistage amplifier that is responsive to the input signal applied to the initial stage;
 a first feedback loop coupling the output of the initial stage to the second input of the initial stage, and providing a first current-mode feedback signal to the second input of the initial stage, the first feedback loop comprising a high pass filter;
 a second feedback loop coupling the output of the final stage to the second input of the initial stage, and providing a second current-mode feedback signal to the second terminal of the initial stage, the second feedback loop comprising a low pass filter; and
 wherein the combined feedback signal is formed by combining the first and second current-mode feedback signals.

24. The radio base station of claim 23, further comprising a radio frequency (RF) power amplifier including a RF signal input to receive an input signal and a supply voltage input coupled to the output of the final stage of one of the at least one multistage amplifiers, and wherein the RF power amplifier generates a RF output signal by amplifying the RF input signal.

25. The radio base station of claim 24, wherein the one multistage amplifier and the RF power amplifier comprise at least a portion of an envelope-elimination-and-restoration (EER) circuit, and wherein the final output signal of the one multistage amplifier serves as the supply voltage for the RF power amplifier, such that amplitude modulations in the final output signal impart amplitude modulations to the RF output signal.

26. The radio base station of claim 25, wherein the first input of the initial stage of the one multistage amplifier is coupled to an amplitude modulation signal representing desired amplitude modulation information, and further wherein the RF signal input of the RF power amplifier is coupled to a phase modulation signal representing desired phase modulation information, such that the RF output signal includes desired amplitude and phase modulation information.

27. The radio base station of claim 26, further comprising transmit processing resources generating the amplitude and phase modulation signals based on desired transmit information.

28. The radio base station of claim 25, further comprising a transmit antenna, and wherein the RF output signal from the RF power amplifier is transmitted via the transmit antenna.

29. The radio base station of claim 23, wherein the high pass filter has a lower roll-off frequency, and the low pass filter has an upper roll-off frequency.

30. The radio base station of claim 29, wherein the high pass and low pass filters comprise matched filter circuits such that a parallel combination of the high and low pass filters exhibits a desired impedance value across a signal frequency range of interest.

31. The radio base station of claim 30, wherein the desired impedance value is a relatively constant value across the signal frequency range of interest.

32. The radio base station of claim 31, wherein the desired impedance value varies across the signal frequency range of interest to compensate for non-uniformity in the frequency response of the multistage amplifier.

33. The radio base station of claim 23, wherein the high pass filter of the first feedback loop exhibits a zero at about DC and a pole at about 20 MHz, and further wherein the low pass filter of the second feedback loop exhibits a pole at about 10 MHz.

34. The radio base station of claim 23, wherein the high pass filter of the first feedback loop exhibits a zero at about DC and a pole at about 60 MHz, and further wherein the low pass filter of the second feedback loop exhibits a pole at about 30 MHz.

35. The radio base station of claim 23, wherein the high pass filter of the first feedback loop exhibits a zero at about DC and a pole at about 120 MHz, and further wherein the low pass filter of the second feedback loop exhibits a pole at about 60 MHz.

36. The radio base station of claim 23, wherein the multistage amplifier exhibits frequency peaking at about 60 MHz, and wherein the high pass filter of the first feedback loop exhibits a zero at about DC and a pole at about 60 MHz, and further wherein the low pass filter of the second feedback loop exhibits a pole at about 50 MHz.

37. The radio base station of claim 23, wherein the upper and lower roll-off frequencies, respectively, of the low and high pass filters are set relative to a desired crossover frequency.

38. A method of improving the performance of a multistage amplifier having at least initial and final stages, the method comprising:
 deriving a current-mode first feedback signal from an output of the initial stage;
 deriving a current-mode second feedback signal from an output of the final stage;
 combining the first and second feedback signals to form a combined feedback signal;
 applying the combined feedback signal to a feedback input of the initial stage; and wherein deriving the first feedback signal comprises closing a high-pass inner feedback loop from the output of the initial stage to the feedback input of the initial stage, and wherein deriving the second feedback signal comprises closing a low-pass outer feedback loop from the output of the final stage to the feedback input of the initial stage.

39. The method of claim 38, further comprising setting frequency responses for the inner and outer feedback loops such that a parallel impedance formed by the inner and outer feedback loops is substantially constant across a frequency range of interest.

40. The method of claim 38, further comprising tuning the frequency responses of the inner and outer feedback loops to compensate for a frequency response of the multistage amplifier.

41. The method of claim 40, further comprising setting a frequency crossover point between the inner and outer feedback loops to coincide with a frequency response peak of the multistage amplifier.

42. The method of claim 41, further comprising adjusting the frequency response roll-offs of the inner and outer loops at the frequency crossover point such that the frequency response peak of the multistage amplifier is attenuated.

43. The method of claim 38, further comprising setting the frequency responses of the inner and outer feedback loops such that an impedance of the parallel combination of loops effects pole-zero compensation of the multistage amplifier.

44. The method of claim 38, further comprising setting a frequency response of at least one of the first and second feedback signals to compensate for a frequency response of the multistage amplifier.

45. The method of claim 38, further comprising setting frequency responses for the first and second feedback signals such that a frequency crossover point between the frequency responses of the first and second feedback signals coincides with a frequency response peak of the multistage amplifier.

46. The method of claim 38, further comprising setting frequency responses for the first and second feedback signals to perform pole-zero frequency compensation of the multistage amplifier.

47. The method of claim 38, further comprising setting an upper roll-off frequency of the second feedback signal such that the second feedback signal substantially excludes signal frequencies beyond a critical frequency associated with stability of the multistage amplifier.

48. The method of claim 47, further comprising establishing the critical frequency to be no greater than a frequency at which the second feedback signal experiences phase shift sufficient to cause instability of the multistage amplifier.

49. The method of claim 38, further comprising tuning frequency responses of the first and second feedback signals such that the first feedback signal dominates the combined feedback signal at higher frequencies of a signal to be amplified by the multistage amplifier, and the second feedback signal dominates the combined feedback signal at lower frequencies of the signal to be amplified.

50. The method of claim 38, further comprising setting an upper frequency roll-off of the second feedback signal in combination with a lower frequency roll-off of the first feedback signal to achieve a desired multistage amplifier frequency response.

51. The method of claim 50, further comprising setting the upper frequency roll-off of the second feedback signal to be below a critical frequency at which feedback from the final stage to the initial stage would otherwise cause the instability in the multistage amplifier.

52. The method of claim 38, further comprising setting frequency responses for the first and second feedback signals to balance between loop-gain and phase margin of the multi-stage amplifier.

* * * * *